United States Patent
Cho et al.

(10) Patent No.: US 8,193,880 B2
(45) Date of Patent: Jun. 5, 2012

(54) TRANSMITTING RADIO FREQUENCY SIGNAL IN SEMICONDUCTOR STRUCTURE

(75) Inventors: Shu-Ying Cho, Hsinchu (TW); Tzu-Jin Yeh, Hsinchu (TW); Sally Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 440 days.

(21) Appl. No.: 12/023,184

(22) Filed: Jan. 31, 2008

(65) Prior Publication Data

US 2009/0195327 A1    Aug. 6, 2009

(51) Int. Cl.
*H03H 7/38* (2006.01)
*H01P 3/08* (2006.01)

(52) U.S. Cl. .......................................... 333/238; 333/33
(58) Field of Classification Search .................... 333/33, 333/34, 4, 5, 238, 246
See application file for complete search history.

(56) References Cited

U.S. PATENT DOCUMENTS

| | | | |
|---|---|---|---|
| 5,841,333 A * | 11/1998 | Fishburn et al. | 333/238 |
| 6,060,383 A | 5/2000 | Nogami et al. | |
| 6,465,367 B1 | 10/2002 | Tsai | |
| 6,864,757 B2 * | 3/2005 | du Toit et al. | 333/34 |
| 6,950,590 B2 | 9/2005 | Cheung et al. | |
| 6,985,056 B2 * | 1/2006 | Kanno | 333/238 |
| 7,081,648 B2 | 7/2006 | Tsai | |
| 7,102,456 B2 * | 9/2006 | Berg | 333/4 |
| 7,242,272 B2 | 7/2007 | Ham et al. | |
| 7,305,223 B2 * | 12/2007 | Liu et al. | 455/333 |
| 2004/0017270 A1 * | 1/2004 | Nagra et al. | 333/156 |
| 2005/0040915 A1 * | 2/2005 | Ryu et al. | 333/161 |

FOREIGN PATENT DOCUMENTS

| | | |
|---|---|---|
| JP | 05-251914 | 9/1993 |
| KR | 10-2008-0054670 | 6/2008 |

OTHER PUBLICATIONS

Korean Patent Office, Office Action dated May 19, 2011, Application No. 10-2010-0008025; 5 pages and English translation of 5 pages.

* cited by examiner

*Primary Examiner* — Stephen Jones
(74) *Attorney, Agent, or Firm* — Haynes and Boone, LLP (57) ABSTRACT

A semiconductor device for transmitting a radio frequency signal along a signal line includes a signal line that extends along a principal axis. On one side of the signal line is a first dielectric, and on the opposite side of the signal line is a second dielectric. First and second ground lines are proximate to the first and second dielectrics, respectively, and the ground lines are approximately parallel to the signal line. The device has a transverse cross-section that varies along the principal axis.

16 Claims, 13 Drawing Sheets

TRANSMITTING RADIO FREQUENCY SIGNAL IN SEMICONDUCTOR STRUCTURE

BACKGROUND

Semiconductor devices continue to get smaller as manufacturers find new ways to reduce feature size. As semiconductor feature sizes are reduced, the importance of controlling the transmission of radio frequency signals within such devices becomes more important.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to semiconductors and a device for transmitting a radio frequency signal within a semiconductor structure. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
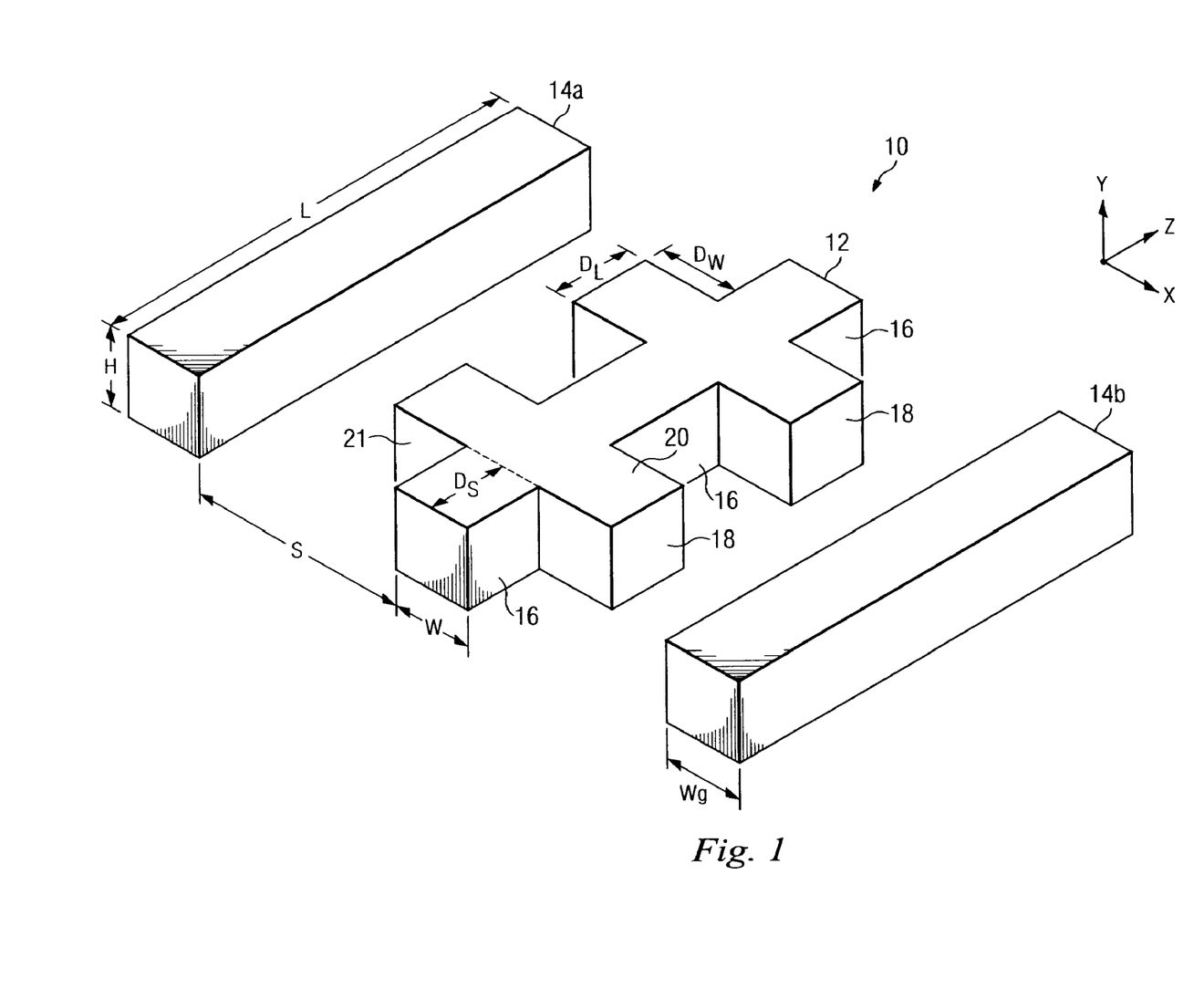
FIG. 1 illustrates a perspective view of an embodiment of a coplanar waveguide.

Referring to FIG. 1, illustrated is a perspective view of one embodiment of a coplanar waveguide 10 that includes a signal line 12. To one side of the signal line 12 is a relatively static line 14a, and to the opposite side of the signal line 12 is another relatively static line 14b (collectively, relatively static lines 14). For the sake of example, the relatively static lines 14 may also be referred to as ground lines, because in many embodiments they will be electrically coupled to ground. Signal line 12 and ground lines 14 are oriented substantially parallel to one another in a longitudinal direction.

Signal line 12 and ground lines 14 extend longitudinally a distance L and have a substantially uniform height H. Each ground line 14 has a width $W_g$, and the width $W_g$ may be the same for each ground line 14 or it may be different. In some embodiments, both ground lines 14 may be equally wide (that is, the ground lines 14a, 14b may have the same width $W_g$). Ground lines 14 may be wider than they are high (i.e., $W_g > H$), or they may be higher than they are wide (i.e., $H > W_g$), or they may be square ($W_g = H$).

As shown in FIG. 1, the dimensions of signal line 12 vary along the longitudinal (z) axis. More specifically, the signal line 12 includes a series of alternating segments 16 and 18. A first segment 16 has a width W and a length $D_S$. The signal line 12 has protrusions 20, 21 at the second segment 18 that extend out horizontally on either side of signal line 12 toward ground lines 14, thus making the second segment 18 wider than the first segment 16. The protrusions 20, 21 have a length $D_L$ and width $D_W$, but in other embodiments the protrusion 20 may have different dimensions than the protrusion 21.

The alternating first segments 16 and second segments 18 form a periodic structure in signal line 12. The periodic structure repeats with a period of $D_S + D_L$. In other embodiments, the signal line 12 may have a nonperiodic structure, or it may have a structure that includes more or fewer segments.

The dimensions of the coplanar waveguide 10 may be selected to provide a desired signal characteristic, for example, a desired phase velocity as described below. In some embodiments, the dimensions W, $D_S$, $D_L$, and $D_W$ may each be between about 0.1 μm and about 8 μm.

The relatively static lines 14 are coupled to an electric ground and hence are also referred to as ground lines 14. In another embodiment, one or both relatively static lines 14 may be coupled to an AC or DC voltage source, including a reference voltage source. The signal line 12 is coupled to a wave source that may be any suitable radio frequency signal source, such as a transmitter, a transceiver, or an antenna. The signal line 12 may also be coupled to a radio frequency signal consumer, such as an antenna, a receiver, or a transceiver. Thus the signal line 12 may carry a radio frequency signal along its length. In some embodiments, the signal line may be designed to carry a radio frequency signal in the microwave range, for example, between about 300 MHz and about 300 GHz.

The signal line 12 is composed of any material capable of propagating a radio frequency signal, such as a metal. The ground lines 14 are composed of any material capable of shielding, such as a metal. Thus the signal line 12 and the ground lines 14 may all be composed of a metal, such as copper, aluminum, or silver, or a metal alloy. The signal line 12 may be composed of the same or a different material as the ground lines 14, and the ground line 14a may be composed of the same or a different material as the ground line 14b. In the region between the signal line 12 and the ground lines 14 is a dielectric or other suitable material (not illustrated).

Figure 2A:
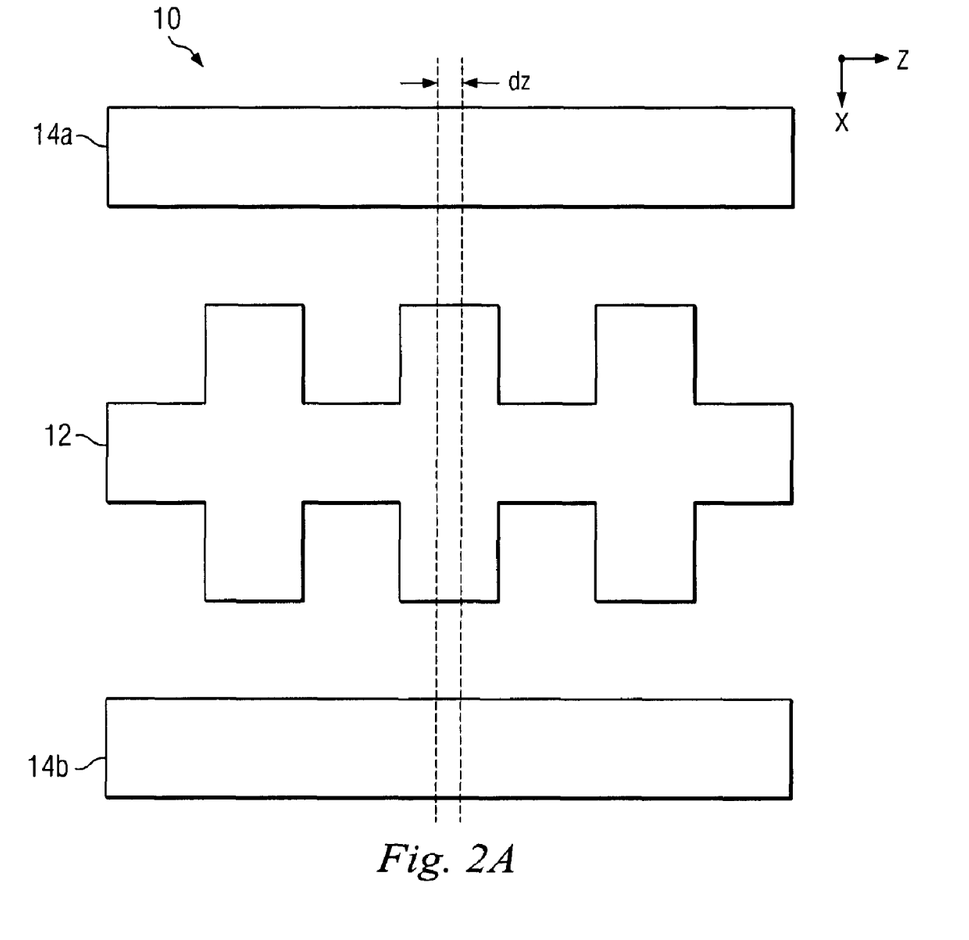
FIGS. 2A and 2B illustrate a top view of an embodiment of a coplanar waveguide and an equivalent circuit for a differential length of the coplanar waveguide, respectively.
Figure 2B:
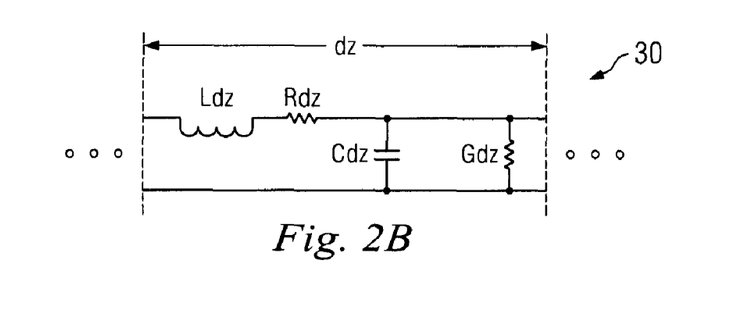

The electrical and radio frequency characteristics of the device in FIG. 1 will now be described by making reference to FIGS. 2A and 2B. Using distributed circuit theory, the coplanar waveguide 10 may be modeled using a series of equivalent circuits. For each differential unit length dz, the coplanar waveguide 10 may be treated as if it were comprised of an equivalent circuit 30. The equivalent circuit 30 has an inductance per unit length L, resistance per unit length R, capacitance per unit length C and conductance per unit length G. Thus the coplanar waveguide 10 may be described using line parameters base on electric circuit concepts.

The values of L, R, C, and G may be determined from the physical characteristics of the coplanar waveguide 10, including its physical dimensions and material composition. The phase velocity Vp of a wave traveling along the signal line may be expressed as:

$$Vp = \frac{c}{\sqrt{\varepsilon_r \mu_r}} = \frac{1}{\sqrt{LC}}$$

where c is the speed of light, $\varepsilon_r$ is the relative permittivity, and $\mu_r$ is the relative permeability. Thus, to design a coplanar waveguide to have a desired phase velocity, the materials for the coplanar waveguide may be chosen to provide a desired relative permittivity and permeability. Alternately, the coplanar waveguide may be dimensioned to provide the desired inductance and capacitance using the structures disclosed herein.

For example, the second segment 18 is relatively wider than the first segment 16, so the distance from the signal line 12 to each ground line 14 is relatively less. Because capacitance varies inversely with the distance between two terminals, the capacitance C in second segment 18 may be different than the capacitance in first segment 16. The inductance L may be similarly affected. Thus, the inductance and capacitance in second segment 18 may be different than the inductance and capacitance in first segment 16. By selecting appropriate dimensions for the coplanar waveguide 10, the value of the product LC may be adjusted and, as a result, a desired phase velocity Vp may be obtained for a radio frequency signal transmitted along the signal line 12.

Figure 3:
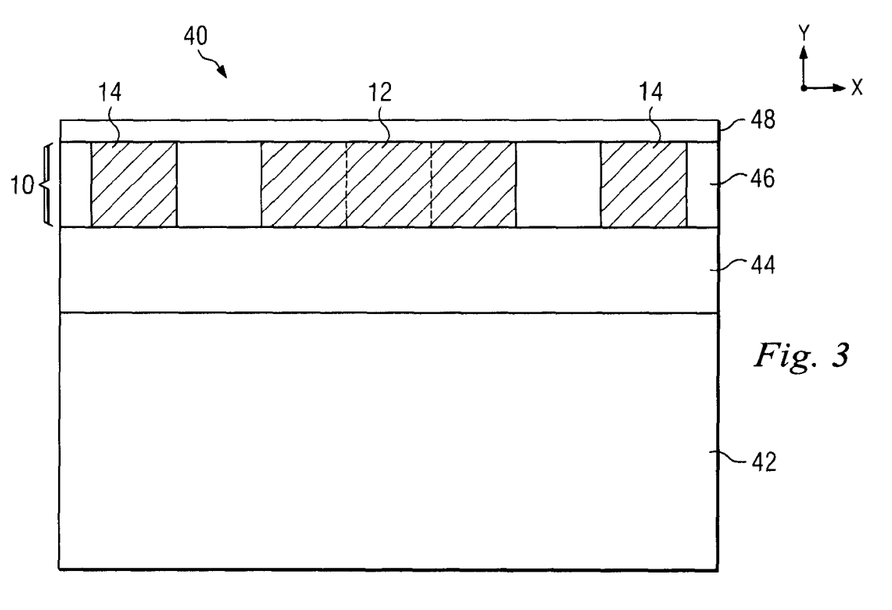
FIG. 3 illustrates a transverse cross-sectional view of a semiconductor with a coplanar waveguide.

Referring now to FIG. 3, illustrated is a transverse cross-sectional view of a device 40 that includes an embodiment of the coplanar waveguide 10. The device 40 includes a lower substrate 42, which may include zero or more layers. The lower substrate 42 may include partially or fully fabricated semiconductor devices or structures, including but not limited to gates, transistors, diodes, vias, trenches, insulators, and interconnects. The lower substrate 42 may be composed of any suitable material or combination of materials, including but not limited to Si, GaAs, SiGe, $SiO_2$, SiN, SiC, SiCN, Cu, W, Ag, Au, and Al.

Formed over the lower substrate 42 is an upper substrate 44. The upper substrate 44 may be relatively thick or relatively thin and may include zero or more layers. For example, the upper substrate 44 may be an insulating layer composed of a low-k dielectric material with a dielectric constant of less than about 3.9. In other embodiments, the upper substrate 44 may be one or more insulating layers that include a suitable dielectric material, including in some embodiments a low-k material or a high-k material. In still other embodiments, the upper substrate 44 may be absent altogether.

Formed over the upper substrate 44 is a coplanar waveguide layer 46. The coplanar waveguide layer 46 includes conductive and insulating regions that form a coplanar waveguide 10. Thus, the coplanar waveguide layer 46 includes a signal line 12 and ground lines 14 that are composed of a metal, such as copper, aluminum, or silver, or a metal alloy. The regions of coplanar waveguide layer 46 not occupied by the signal line 12 and the ground lines 14 are any suitable dielectric material, including in some embodiments a low-k material or a high-k material.

Formed over the coplanar waveguide layer 46 is an insulating layer 48. The insulating layer 48 is composed of any suitable dielectric material, including in some embodiments a low-k material or a high-k material.

In some embodiments, the composition of the dielectric materials in the upper substrate 44, the coplanar waveguide layer 46, and the insulating layer 48 may be the same. In other embodiments, the composition of the dielectric materials in those layers may be different. It is understood that the dielectric material affects the capacitance and inductance of the coplanar waveguide.

In other embodiments, the device 40 may include additional layers above, below, or between the illustrated layers. For example, the device 40 may include a metal shield layer disposed between the lower substrate 42 and the upper substrate 44, above the insulating layer 48, or both. The device 40 may also include other features or structures. For instance, the upper substrate 44 may include vias to couple components or structures in the coplanar waveguide layer or another layer to components or structures in the lower substrate 42.

Figure 4:
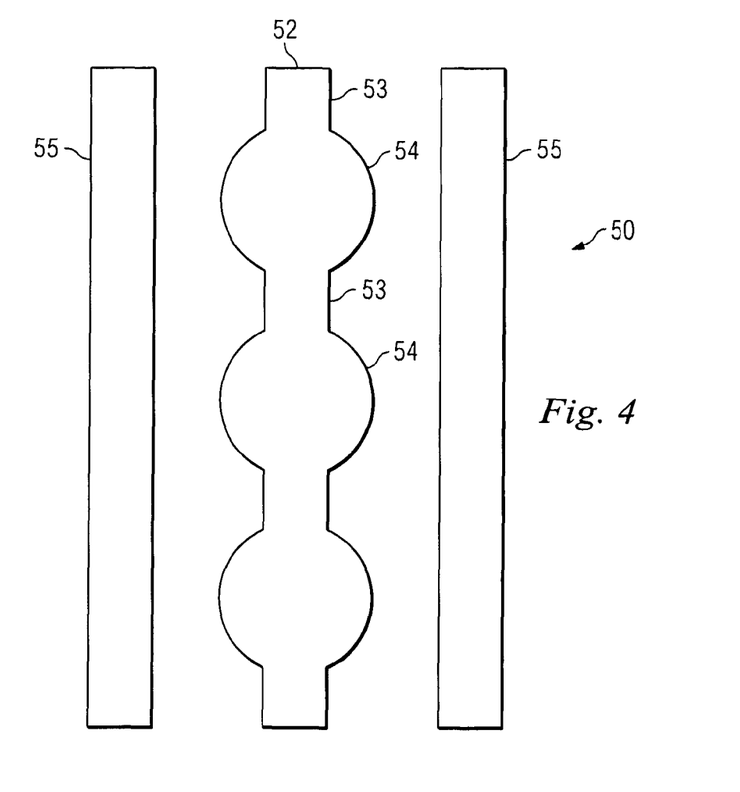
FIGS. 4-11 illustrate top views of various embodiments of a coplanar waveguide.

Referring now to FIG. 4, illustrated is another embodiment of a coplanar waveguide 50. The coplanar waveguide 50 has a signal line 52 that is similar to the signal line 12 described above. The signal line 52 includes first and second segments 53, 54. The second segments 54 are wider than the first segments 53. The second segments 54 extend outwardly toward the ground lines 55 with a semi-circular shape.

Figure 5:
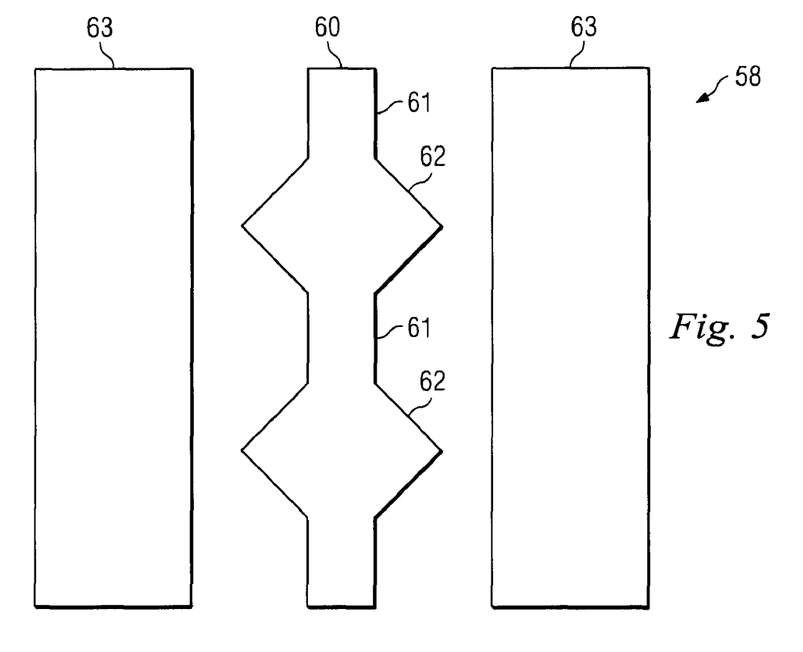

Other shapes for first and second segments 53, 54 are also possible. For example, FIG. 5 illustrates another embodiment of a coplanar waveguide 58 that includes a signal line 60 with first segments 61 and second segments 62. The second segments 62 have generally triangular-shaped extensions. In other embodiments, the second segments 62 may have extensions with other shapes, including for example elliptic and semi-circular extensions. The coplanar waveguide 58 also include ground lines 63.

Figure 6:
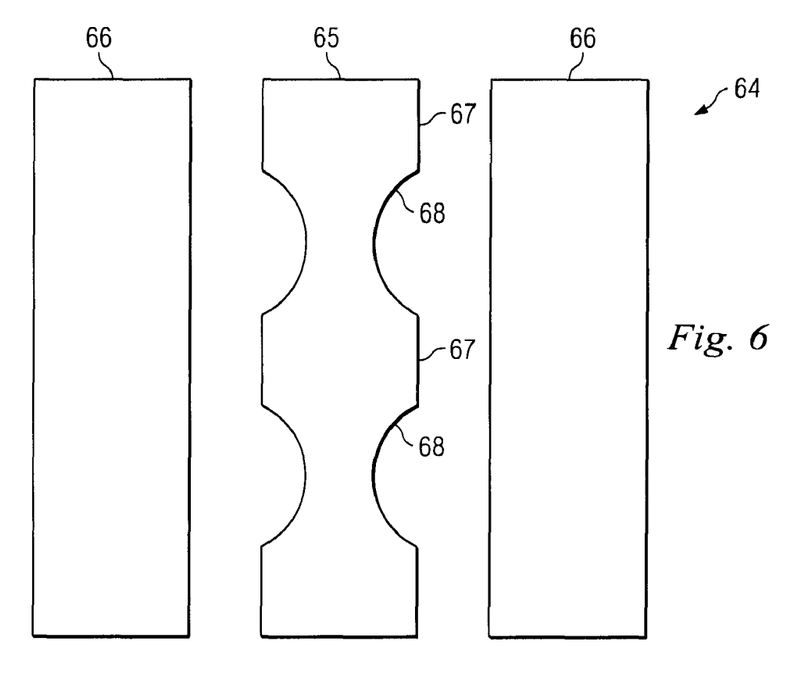

FIG. 6 shows another example of a coplanar waveguide 64. The coplanar waveguide 64 includes a signal line 65 and ground lines 66. The signal line 65 has irregularly shaped segments 67 formed by semi-circular indentations 68.

Figure 7:
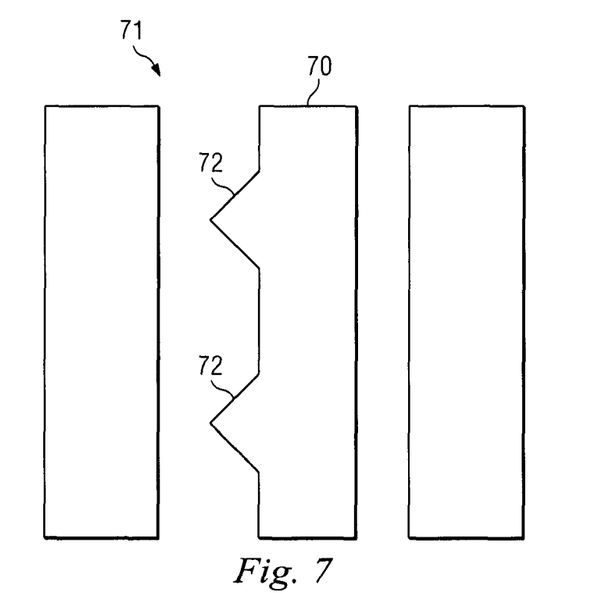

FIG. 7 shows another embodiment of a coplanar waveguide 71. The coplanar waveguide 71 includes a signal line 70 with asymmetric segments 72. The asymmetric segments 72 extend outwardly toward one of the ground lines. In other embodiments, the asymmetric segments 72 may extend outwardly toward both ground lines, but may extend outwardly in unequal fashion. That is, the signal line 70 may have asymmetric segments 72 that extend outwardly toward a first ground line more than to a second ground line. Thus, the signal line 70 may be asymmetric about the longitudinal axis.

Figure 8:
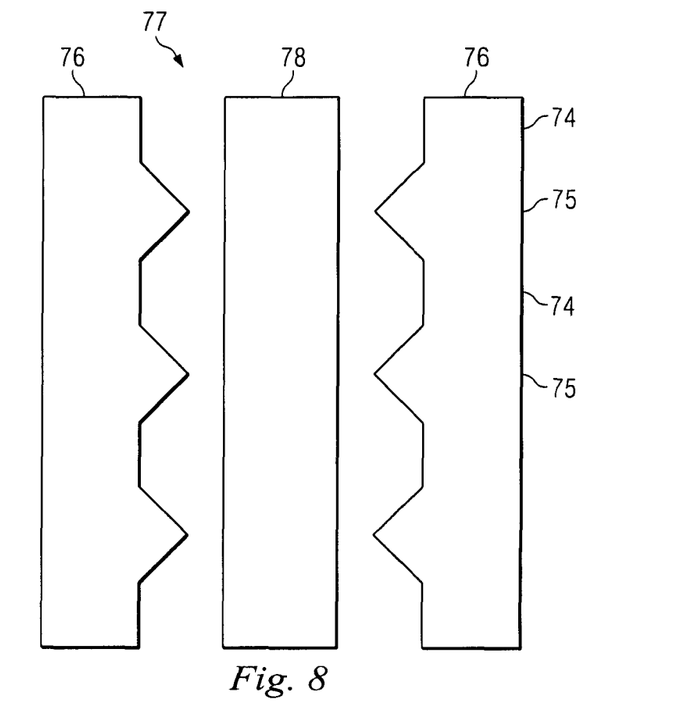

FIG. 8 shows another embodiment of a coplanar waveguide 77 that includes a signal line 78 and ground lines 76. The ground lines 76 include first and second segments 74, 75. Second segments 75 extend outwardly toward the signal line 78. The signal line 78 has a substantially uniform width and height.

Figure 9:
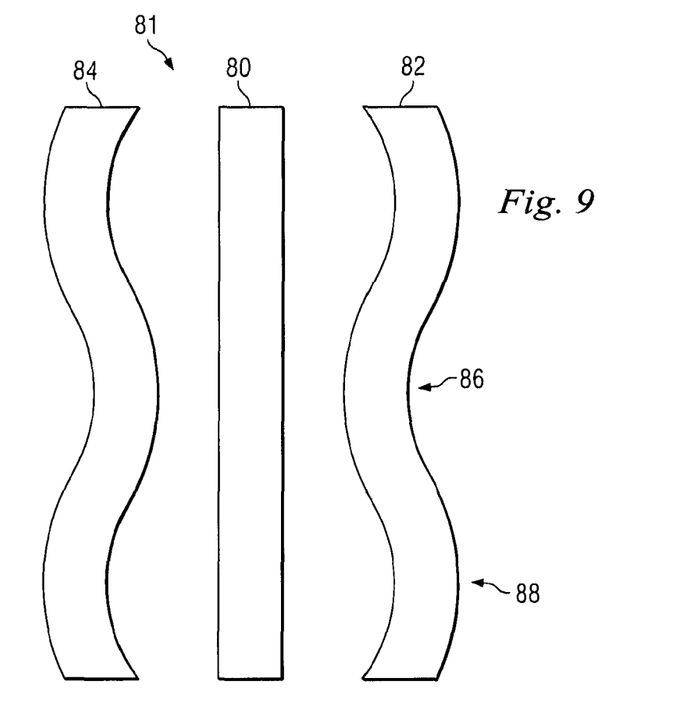

FIG. 9 shows another embodiment of a coplanar waveguide 81. The coplanar waveguide includes a signal line 80 that is substantially uniform in width and two ground lines 82 and 84 that are also substantially uniform in width. The ground line 82 has a first portion 86 where the distance between the signal line 80 and the ground line 82 is relatively small, and a second portion 88 where the distance between the signal line 80 and the ground line 82 is relatively large. Although the distance between the signal line 80 and the ground line 82 varies vary, the signal line 80 and the ground line 82 are oriented in a same direction and are substantially parallel. The ground line 84 includes similar first and second portions. FIG. 9 illustrates the first portions of ground lines 82, 84 as coinciding at a longitudinal position along the length of the coplanar waveguide. The second portions of ground lines 82, 84 are similarly depicted as coinciding. That is, the ground line 84 is a substantially mirror image of the ground line 82 reflected across a plane that bisects the signal line lengthwise. However, in other embodiments the first portion of ground line 82 may coincide with the second portion of ground line 84. That is, the ground line 84 may be a substantially mirror image of ground line 82 that has been longitudinally shifted. In still other embodiments, the ground line 82 may have a form that is unrelated to the form of ground line 84. Furthermore, although FIG. 9 illustrates ground lines 82, 84 as having curved sides, the sides of ground lines 82, 84 may also be square, angled, or any other shape or combination of shapes.

Figure 10:
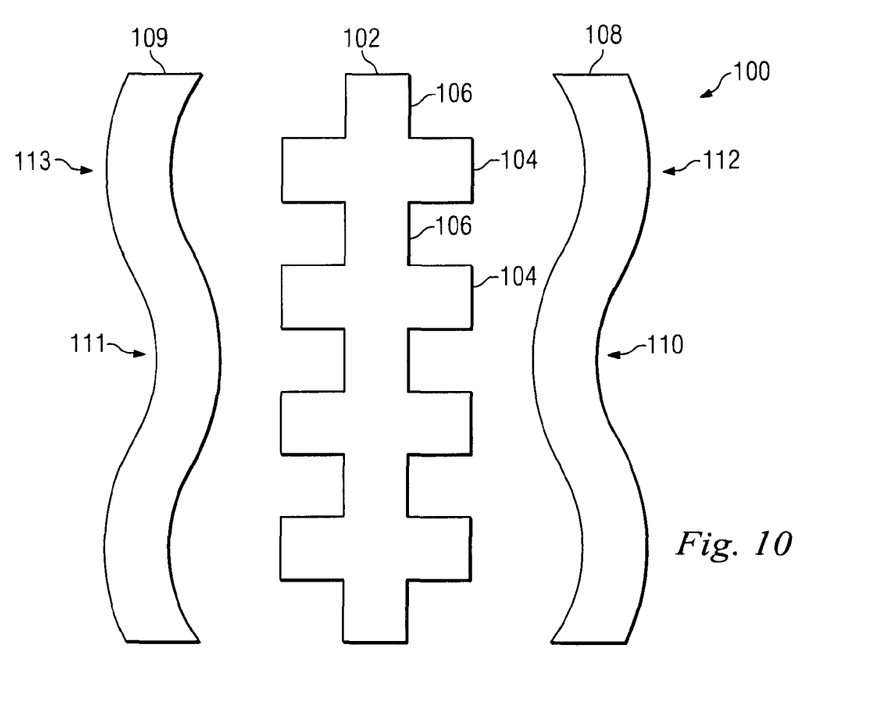

It is understood that various aspects of the coplanar waveguide structures disclosed herein may be combined in a single coplanar waveguide structure. For example, FIG. 10 shows a coplanar waveguide 100 that includes a signal line 102 that is similar to the signal line 12 in FIG. 1. The signal line 102 includes a series of alternating wide segments 104 and narrow segments 106. The coplanar waveguide 100 also includes two ground lines 108, 109. Similar to the ground lines 82, 84 in FIG. 9, the ground lines 108, 109 include first portions 110, 111 where the distances between the signal line 102 and the ground lines 108, 109 are relatively small, and second portions 112, 113 where the distances between the signal line 102 and the ground lines 108, 109 are relatively large.

Figure 11:
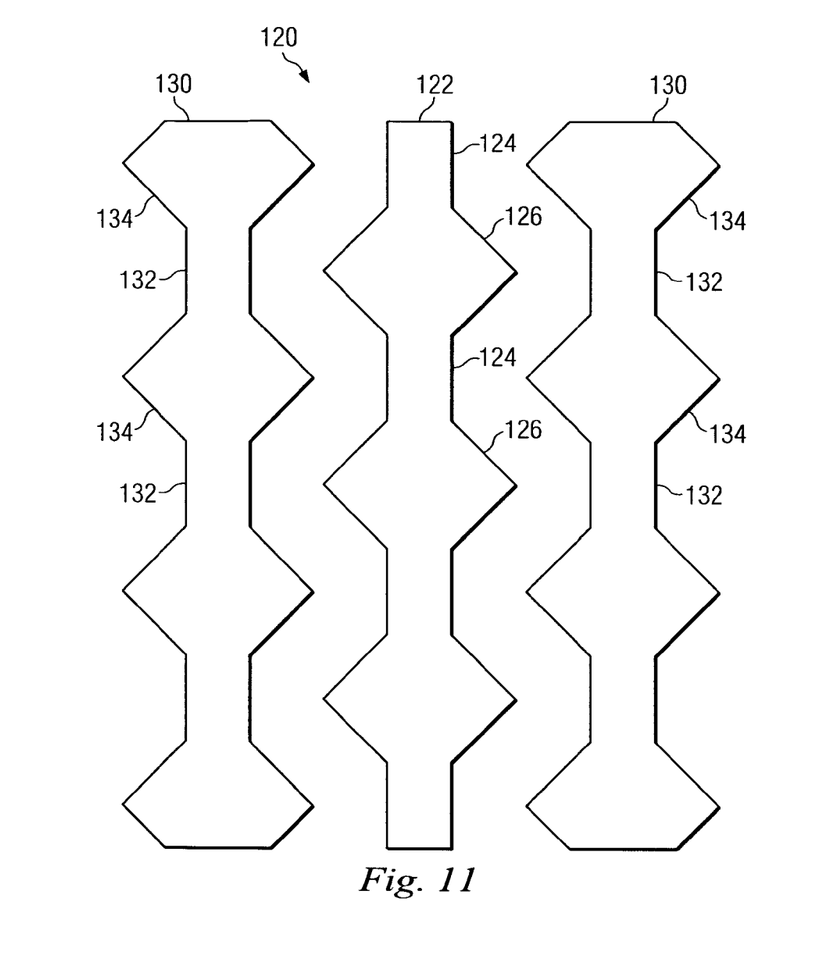

FIG. 11 shows another embodiment of a coplanar waveguide 120. The coplanar waveguide 120 includes a signal line 122 that is similar to the signal line 67 in FIG. 5. The signal line 122 includes a series of alternating first segments 124 and second segments 126. The second segments 126 are wider than the first segments 124, and the second segments 126 have a form that gives the signal line 122 the general appearance of having triangular protrusions. In some embodiments, the first segments 124 and second segments 126 may alternate periodically.

The coplanar waveguide 120 also includes ground lines 130 that are similar to the ground lines 76 illustrated in FIG. 8. The ground lines 130 include a series of alternating first segments 132 and second segments 134, and in some embodiments the segments may alternate periodically. The first segments 132 of the ground line 130 may be similar in form to the first segments 124 of the signal line 122, or they may be different. Likewise, the second segments 134 of the ground line 130 may be similar in form to the second segments 126 of the signal line 122, or they may be different. The first and second segments 132, 134 may be symmetric or asymmetric about the lengthwise axis of each ground line 130. The first segments 132 of the ground line 130 may coincide with the second segments 126 of the signal line 122, with the first segments 124 of the signal line 122, or with neither.

Figure 12A:
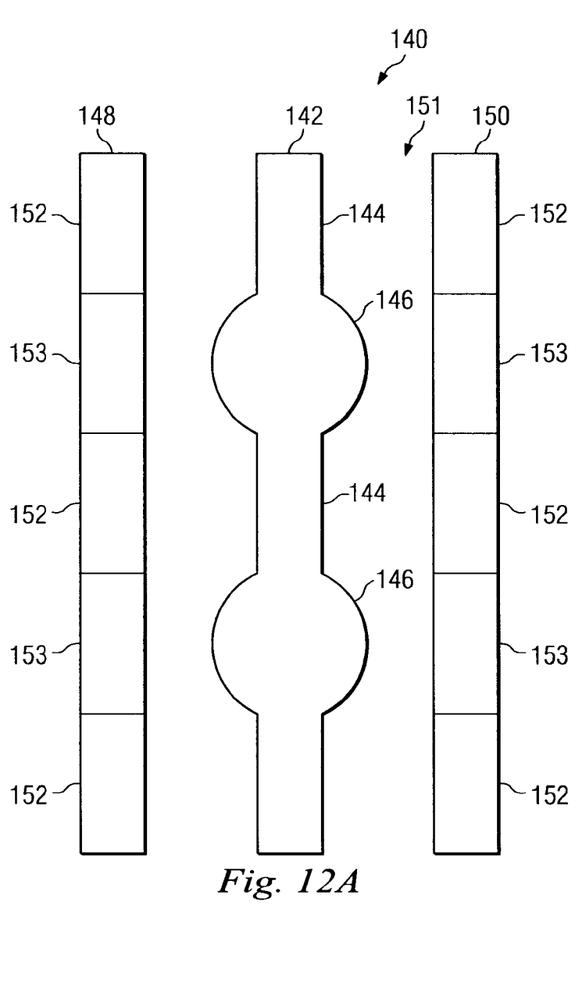
FIGS. 12A and 12B illustrate a top view and perspective view, respectively, of an embodiment of a coplanar waveguide.

FIG. 12A illustrates a top view of another embodiment of a coplanar waveguide 140. The coplanar waveguide 140 includes a signal line 142 with alternating first and second segments 144, 146. In other embodiments, the signal line 142 may be substantially uniform, similar to signal line 78 in FIG. 8. The coplanar waveguide 140 also includes first and second ground lines 148, 150. Between the signal line 142 and the first and second ground lines 148, 150 is an interline region 151 that may include a dielectric material. The first and second ground lines 148, 150 include alternating first and second segments 152, 153. The first and second segments 152, 153 have a substantially similar cross-sectional shape, but they are composed of two or more different materials. For instance, the first segments 152 may be composed of a conductive material, and the second segments 153 may be composed of a nonconductive material. In one embodiment, the first segments 152 may be composed of the same material as the signal line 142, and the second segments 153 may be composed of the same dielectric material as the interline region 151. Because the second segments 153 may be nonconductive, the first segments 152 may be electrically coupled to one another by a conductive interconnect on the same or a different layer.

Figure 12B:
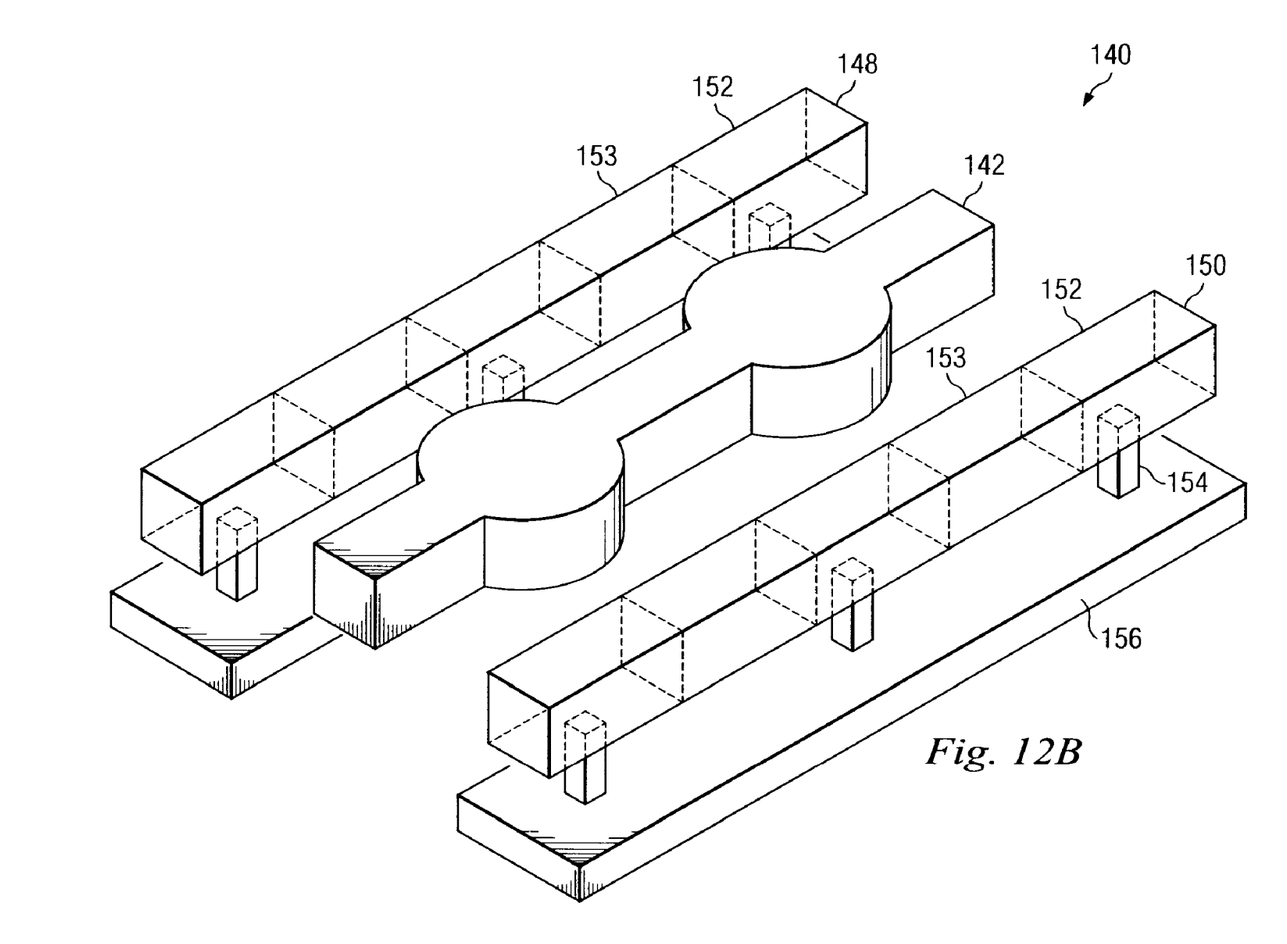

One way that the first segments 152 may be electrically coupled to one another is illustrated in FIG. 12B, which shows a perspective view of the coplanar waveguide 140. Each first segment 152 has a via 154 that couples the first segment 152 to an alternate ground line 156. The alternate ground line 156 is on a lower layer than the signal line 142, but in other embodiments it may be on a higher layer or on the same layer. The vias 154 and the alternate ground line 156 are composed of a conductive material, such as a metal, for example copper or aluminum. The vias 154 and the alternate ground line 156 may be composed of the same material as the ground line 150, or they may be composed of one or more different materials.

Figure 13A:
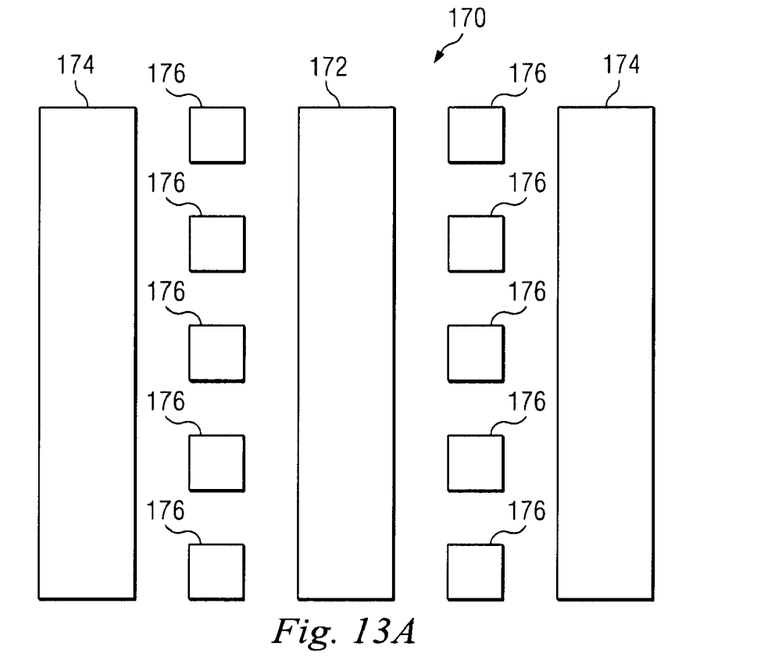
FIGS. 13A and 13B illustrate a top view and perspective view, respectively, of an embodiment of a coplanar waveguide.
Figure 13B:
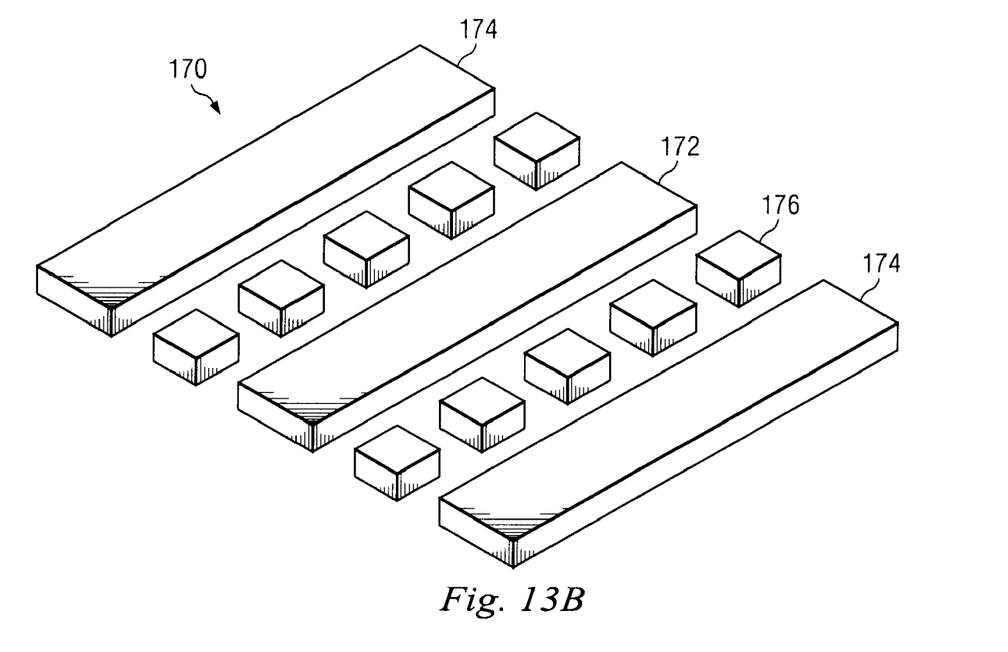

FIGS. 13A and 13B illustrate another embodiment of a coplanar waveguide 170. FIG. 13A shows a top view, and FIG. 13B shows a perspective view. The coplanar waveguide 170 includes a signal line 172 and two ground lines 174 on either side of the signal line 172. Disposed between the signal line 172 and each ground line 174 are islands 176. Some embodiments may have islands 176 between the signal line 172 and only one ground line 174. Some or all of the islands 176 may be electrically intercoupled, or they may be electrically isolated from one another. Some or all of the islands 176 may be electrically coupled to the signal line 172, to one or both of the ground lines 174, or to a reference voltage or signal, or they may be completely electrically isolated. Where one or more islands 176 are electrically coupled, the electrical coupling may be through an interconnect or via on the same or a different layer.

The islands 176 may be any suitable shape, for example, quadrilateral frusta, rectangular prisms, elliptic cylinders, or circular cylinders. The islands 176 may be substantially uniform in form and dimension, or the islands 176 may vary in form, dimension, or both. The islands 176 may be closer to the signal line 172 than to the ground lines 174, or they may be closer to the ground lines 174 than to the signal line 172, or they may be equidistant to the signal line 172 and the nearest ground line 174. In some embodiments, some islands 176 may be closer to the signal line 172 than some other islands 176. That is, the distance between the signal line 172 and the islands 176 may vary over the length of the coplanar waveguide 170.

The islands 176 may have a uniform composition, or their compositions may vary. The islands 176 may be composed of the same or a different material as the signal line 172 or ground lines 174. In some embodiments, all the islands 176 are composed of the same metal as the signal line 172. In other embodiments, some or all of the islands 176 may be a dielectric material.

Figure 14:
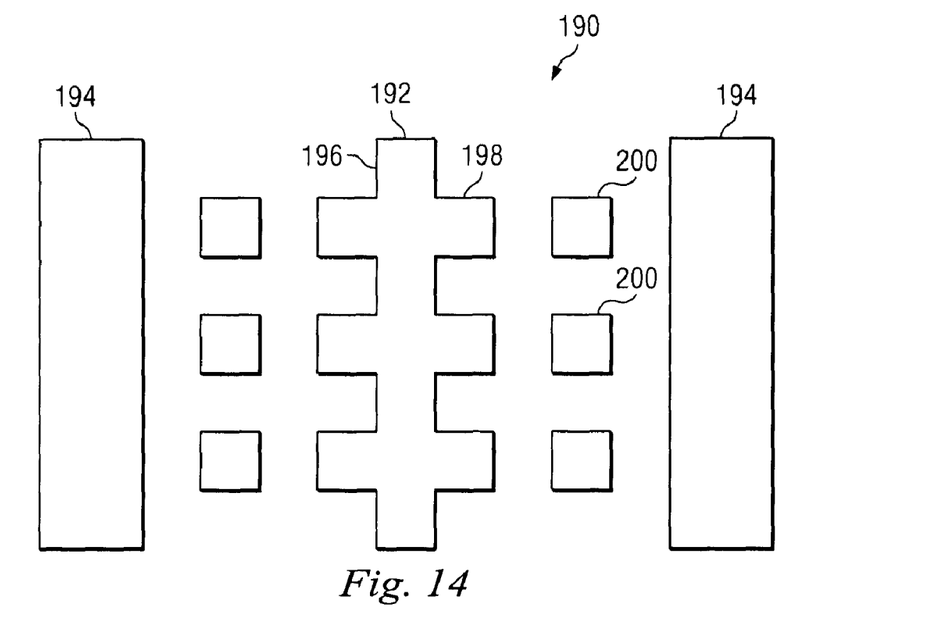
FIG. 14 illustrates a top view of an embodiment of a coplanar waveguide.

FIG. 14 illustrates another embodiment of a coplanar waveguide 190. The coplanar waveguide 190 includes a signal line 192 and two ground lines 194 on either side of the signal line 192. The signal line 192 includes first and second segments 196, 198 similar to the segments previously described with respect to FIG. 1. Disposed between the signal line 192 and each ground line 194 are a plurality of islands 200 similar to those previously described with respect to FIG. 6. The islands 200 coincide with the second segments 198. That is, the coplanar waveguide 190 has islands 200 at periodic intervals along its length, the signal line 192 has second segments 198 at periodic intervals along its length, and the period of the islands 200 is equal to the period of the second segments 198. In other embodiments, the islands 200 may coincide with the first segments 196. In still other embodiments, the islands 200 may be at intervals that do not correspond to the structure of the signal line 192.

Figure 15:
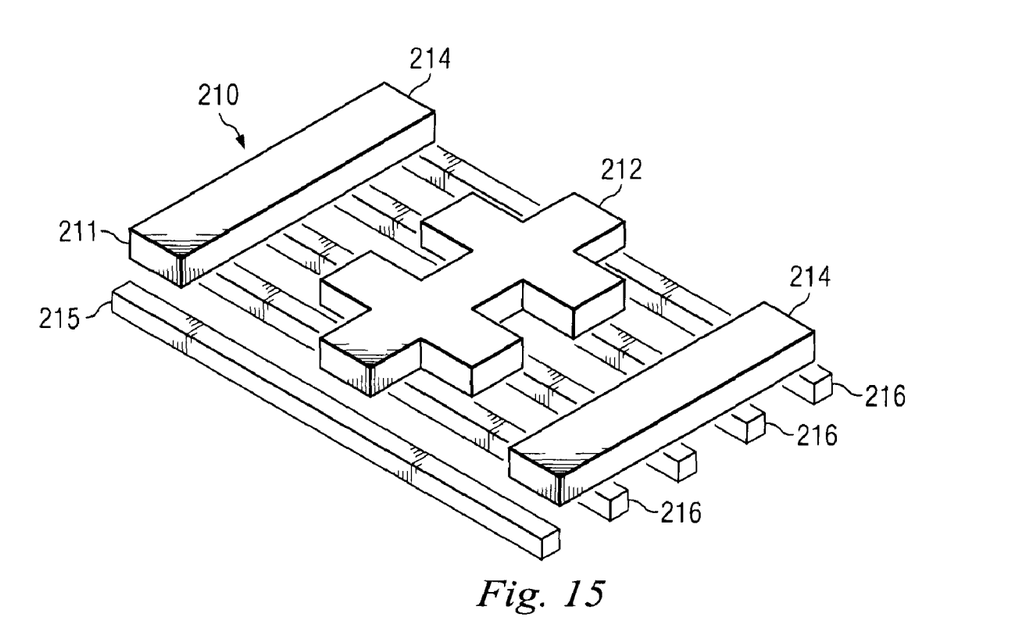
FIGS. 15-17 illustrate perspective views of different embodiments of a coplanar waveguide.

FIG. 15 shows a perspective view of another embodiment of a coplanar waveguide 210. The coplanar waveguide 210 includes first layer 211 that with a signal line 212 and two ground lines 214 on either side of the signal line 212. The signal line 212 is similar to the signal line 12 previously described with respect to FIG. 1. Disposed on a second layer 215 is a plurality of linear conductive strips 216. The second layer 215 is separated from the first layer 211 by a dielectric layer. The second layer 215 is located below the first layer 211, but in other embodiments the second layer 215 may be located above the first layer 211. In some embodiments, the coplanar waveguide 210 may have two second layers 211, one located above the first layer 211 and the other located below.

The linear conductive strips 216 may be similar to the linear conductive strips described in U.S. Pat. No. 7,242,272 to Ham et al., or similar to the floating strips described in U.S. Pat. No. 6,950,590 to Cheung et al., both of which are hereby incorporated by reference. The linear conductive strips 216 may extend across substantially the entire width of the coplanar waveguide 210, or they may extend across a portion of the width of the coplanar waveguide 210.

Figure 16:
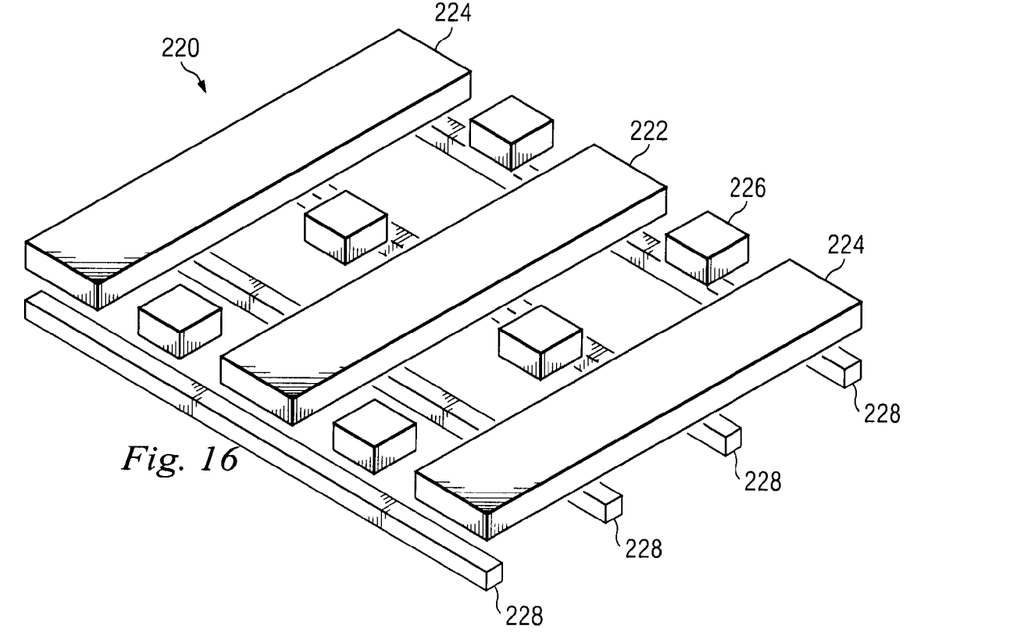

FIG. 16 shows a perspective view of another embodiment of a coplanar waveguide 220. A first layer of the coplanar waveguide 220 includes a signal line 222 and two ground lines 224 on either side of the signal line 222. Disposed between the signal line 222 and each ground line 224 are a plurality of islands 226, similar to the islands 176 described in FIGS. 13A and 13B. The islands 226 may be at periodic intervals along the length of the coplanar waveguide 220. Disposed on a second layer is a plurality of linear conductive strips 228, similar to the plurality of linear conductive strips 216 described with respect to FIG. 15. The linear conductive strips 228 may be at periodic intervals along the length of the coplanar waveguide 220, and the period of the linear conductive strips 228 may be the same as or different than the period of the islands 226. The first and second layers are separated by a dielectric layer.

Figure 17:
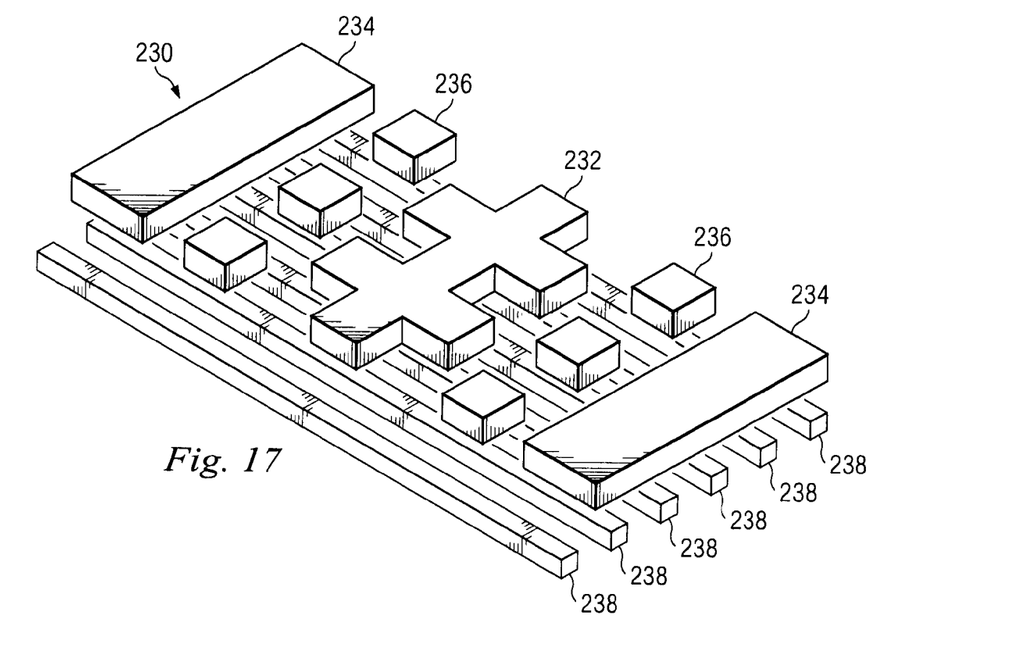

FIG. 17 illustrates a perspective view of another embodiment of a coplanar waveguide 230. The coplanar waveguide 230 includes a signal line 232 and ground lines 234 similar to the signal line 12 and ground lines 14 described in FIG. 1. The coplanar waveguide 230 also includes a plurality of islands 236 similar to the islands 176 described in FIGS. 13A and 13B. Located on another layer are conductive strip lines 238 similar to the conductive strip lines 216 described in FIG. 15. The signal line 232, ground lines 234, islands 236, and conductive strip lines 238 may each have a periodic structure, and their respective periods may be the same, integer multiples of one another, or unrelated.

Figure 18A:
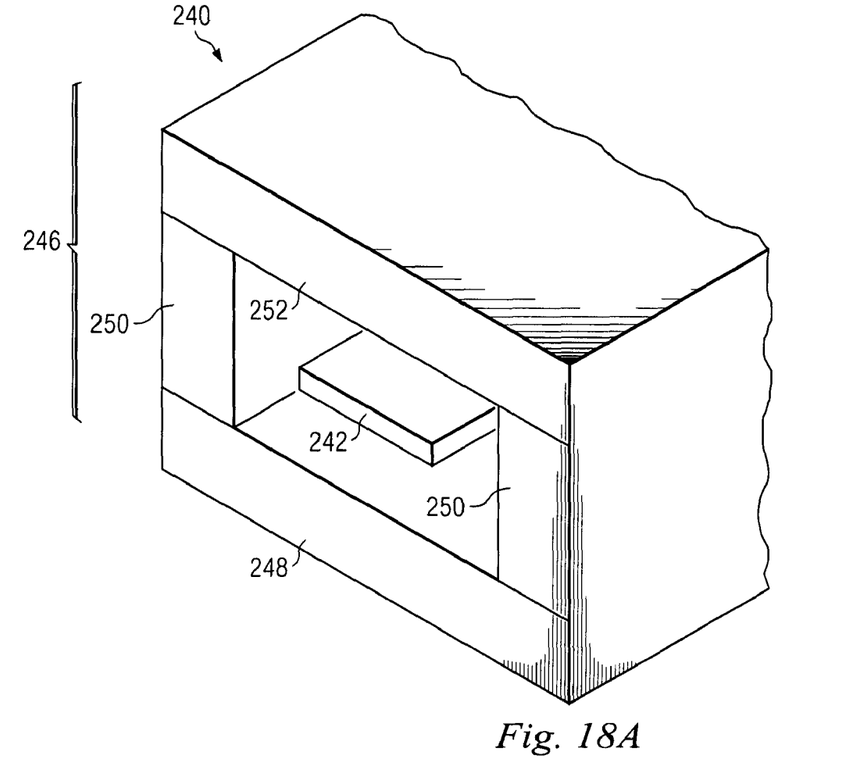
FIGS. 18A and 18B illustrate a perspective view and a transverse cross-sectional view, respectively, of an embodiment of a coaxial transmission line.
Figure 18B:
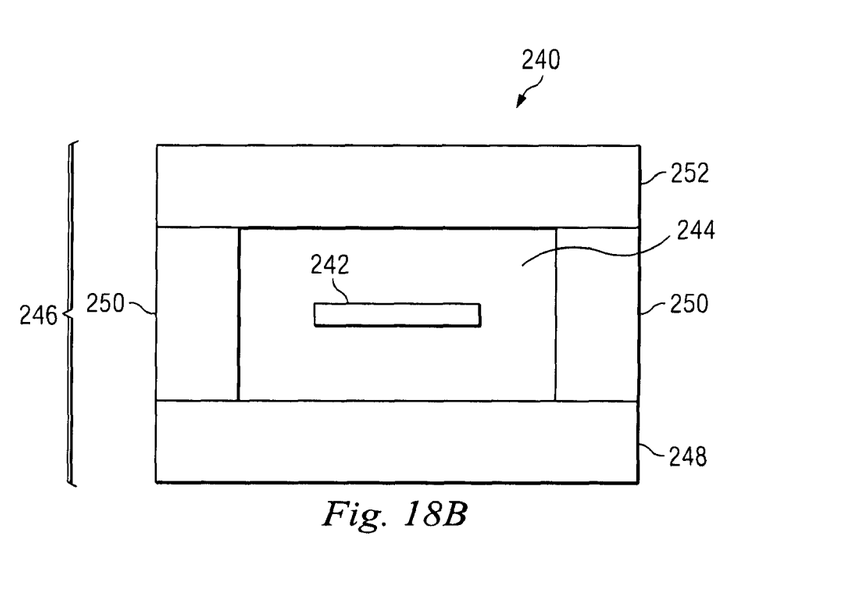

FIG. 18A illustrates a perspective view of an embodiment of a coaxial transmission line 240, and FIG. 18B illustrates a transverse cross-sectional view of the same. The coaxial transmission line 240 includes a signal line 242 extending along a first direction z. Surrounding the signal line 242 is a dielectric 244, and surrounding the dielectric is a composite ground line 246. The composite ground line 246 includes a lower ground plane 248, vias 250, and an upper ground plane 252. The vias 250 electrically couple the lower ground plane 248 to the upper ground plane 252.

The signal line 242, the vias 250, and the lower and upper ground planes 248, 252 may be composed of the same or different materials, and may be composed of a conductive material such as a metal. In some embodiments, the signal line 242, the vias 250, and the lower and upper ground planes 248, 252 may be copper.

The dielectric 244 may be homogeneous or heterogeneous in composition. In some embodiments, the dielectric 244 may be a low-k or a high-k dielectric material. The dielectric 244 may be, for example, a homogenous low-k dielectric material.

Figure 19:
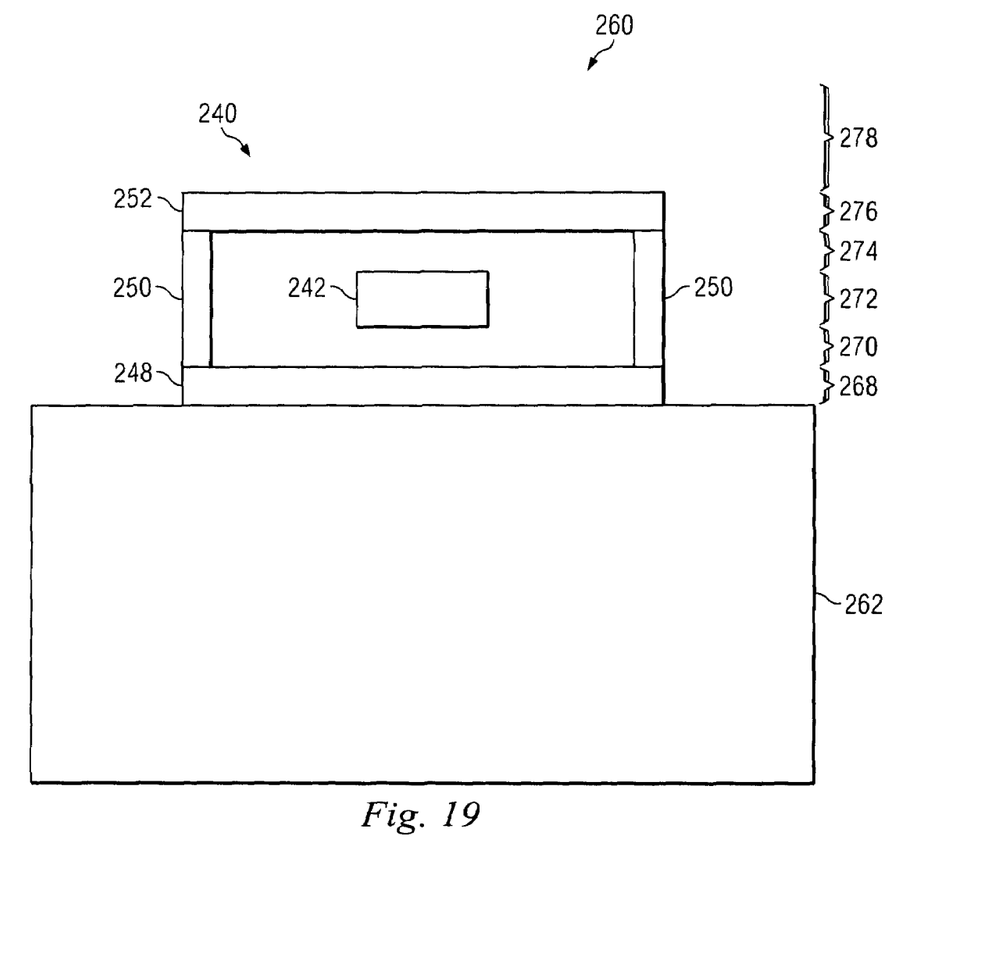
FIG. 19 illustrates a transverse cross-sectional view of a semiconductor with a coaxial transmission line.

Referring now to FIG. 19, illustrated is a transverse cross-sectional view of device 260 that includes the coaxial transmission line 240. The device 260 includes a substrate 262, which may include zero or more layers (not illustrated). The substrate 262 may include partially or fully fabricated semiconductor devices or structures, including but not limited to gates, transistors, diodes, vias, trenches, and interconnects. The substrate 262 may be composed of any suitable material or combination of materials, including but not limited to Si, GaAs, SiGe, $SiO_2$, SiN, SiC, SiCN, Cu, W, Ag, Au, and Al.

Formed over the substrate 262 is a lower ground plane layer 268 that includes the lower ground plane 248. Formed over the lower ground plane layer 268 is a first insulating layer 270. The first insulating layer 270 includes a portion of the vias 250. Formed over the first insulating layer 270 is a signal line layer 272 that includes the signal line 242 and portions of the vias 250. Formed over the signal line layer 272 is a second insulating layer 274 that includes portions of the vias 250. Formed over the second insulating layer 274 is an upper ground plane layer 276 that includes the upper ground plane 252. Finally, formed over the upper ground plane layer 276 is a third insulating layer 278.

The lower ground plane 248, vias 250, signal line 242, and upper ground plane 252 may be composed of any suitable conductor, for example a metal such as copper. The other regions of the lower ground plane layer 268, first insulating layer 270, signal line layer 272, second insulating layer 247, upper ground plane layer 276, and third insulating layer 278 may be any suitable dielectric material, and in some embodiments they may all be the same dielectric material, for example, a low-k dielectric material.

The devices and structures disclosed herein may be formed using well-known semiconductor manufacturing processes, including but not limited to such techniques as physical vapor deposition, chemical vapor deposition, electroplating, molecular beam epitaxy, atomic layer deposition, photolithography, wet and dry etching, plasma etching, thermal annealing, dual damascene process, chemical-mechanical polishing, ion implantation, and the like.

The devices and structures disclosed herein may be used in many products, including but not limited to items such as integrated circuits, monolithic microwave integrated circuits, radio frequency transmitters and receivers, radio frequency communication equipment, antennas, circuit boards, amplifiers, modulators, and demodulators. These and other items may be improved by using one or more of the devices and structures disclosed herein. For example, the devices and structures disclosed herein may allow some items to be made smaller, lighter, more efficient, more powerful, more sensitive, less noisy, more selective, faster, or cheaper.

In summary, a device for transmitting a radio frequency signal along a signal line is disclosed. The device includes a signal line that extends along a principal axis. To one side of the signal line is a first dielectric, and to an opposite side of the signal line is a second dielectric. Proximate to the first dielectric is a first ground line, and proximate to the second dielectric is a second ground line. The first and second ground lines are approximately parallel to the signal line. The device has a transverse cross-section that varies along the principal axis.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A device comprising:
a substrate;
a coplanar waveguide in a first layer over the substrate, the coplanar waveguide having a length and comprising:
  a signal line proximate to the substrate and coupled to a wave source, the signal line comprising a first conductive material and having a first side and a second side, the second side being opposite the first side;
  a first insulator proximate to the substrate and to the first side of the signal line and comprising a first dielectric material;
  a second insulator proximate to the substrate and to the second side of the signal line and comprising a second dielectric material;
  a first ground line proximate to the substrate and to the first insulator and comprising a second conductive material; and
  a second ground line proximate to the substrate and to the second insulator and comprising a third conductive material; and
a dielectric layer between the substrate and the coplanar waveguide;
wherein the coplanar waveguide has a first transverse cross-section that varies over its length;
wherein the first and second ground lines respectively have second and third transverse cross-sections that are uniform over their lengths;
wherein the signal line comprises periodically alternating first and second segments, the first segment being wider than the second segment; and
wherein a first distance between the signal line and the first ground line varies along the length of the coplanar waveguide, a second distance between the signal line and the second ground line varies along the length of the coplanar waveguide, and the first distance is equal to the second distance at each point along the length of the coplanar waveguide.

2. The device of claim 1 wherein the first transverse cross-section varies periodically.

3. The device of claim 1 wherein the first, second, and third conductive materials are the same material.

4. The device of claim 1 wherein the wave source provides a radio frequency signal between about 300 MHz and about 300 GHz.

5. The device of claim 1 wherein the first and second dielectric materials are the same material, and wherein the first and second dielectric materials have a dielectric constant of less than about 3.9.

6. The device of claim 1 wherein the first segment is wider than the second segment by between about 0.1 µm and about 8.0 µm.

7. The device of claim 1 further comprising a plurality of electrically isolated conductive islands disposed in the first insulator and in the second insulator.

8. The device of claim 1 further comprising a plurality of conductive strip lines in a second layer, the conductive strip lines oriented transversally to the coplanar waveguide.

9. The device of claim 1, including a further dielectric layer over the coplanar waveguide.

10. The device of claim 1, wherein the transverse cross-section of the coplanar waveguide is configured so as to cause signals transmitted along the signal line to have a selected phase velocity.

11. A device comprising:
a semiconductor substrate; p1 an insulator over the semiconductor substrate;
a first conductor line over the insulator and oriented substantially along a first direction;
a second conductor line over the insulator spaced closely to and substantially parallel with the first conductor line, the second conductor coupled to a radio frequency wave source; and
a third conductor line over the insulator spaced closely to and substantially parallel with the second conductor line such that the second conductor line is disposed between the first and third conductor lines;
wherein the second conductor line has a periodically widened structure that extends outwardly toward the first and third conductor lines along a second direction transverse to the first direction;
wherein the first and third conductor lines each have a structure of uniform width along the first direction; and
wherein a first distance between the second conductor line and the first conductor line varies along the first direction, a second distance between the second conductor line and the third conductor line varies along the first direction, and the first distance is equal to the second distance at each point along the device in the first direction.

12. A device comprising:
a semiconductor substrate;
an insulator over the semiconductor substrate;
a first conductor line over the insulator and oriented substantially along a first direction;
a second conductor line over the insulator spaced closely to and substantially parallel with the first conductor line, the second conductor coupled to a radio frequency wave source; and
a third conductor line over the insulator spaced closely to and substantially parallel with the second conductor line such that the second conductor line is disposed between the first and third conductor lines;
wherein the second conductor line has a periodically widened structure that extends outwardly toward the first and third conductor lines along a second direction transverse to the first direction; and
wherein the first and third conductor lines each have a structure of uniform width along the first direction.

13. The device of claim 12 wherein the periodically widened structure extends outwardly in a rectangular shape.

14. The device of claim 12 further comprising a plurality of electrically isolated conductive islands disposed between the first and second conductor lines.

15. The device of claim 12 further comprising a plurality of electrically isolated conductive strips disposed transversally to the first direction.

16. The device of claim 12, including a further insulator disposed over the first, second, and third conductor lines.

* * * * *